(12) United States Patent
Sakai

(10) Patent No.: US 10,196,222 B2
(45) Date of Patent: Feb. 5, 2019

(54) DOCUMENT CONVEYING APPARATUS, DETERMINATION METHOD, AND COMPUTER-READABLE, NON-TRANSITORY MEDIUM

(71) Applicant: PFU LIMITED, Kahoku-shi, Ishikawa (JP)

(72) Inventor: Masaaki Sakai, Kahoku (JP)

(73) Assignee: PFU LIMITED, Kahoku-Shi, Ishikawa (JP)

( * ) Notice: Subject to any disclaimer, the term of this patent is extended or adjusted under 35 U.S.C. 154(b) by 39 days.

(21) Appl. No.: 15/174,893

(22) Filed: Jun. 6, 2016

(65) Prior Publication Data
US 2017/0137245 A1 May 18, 2017

(30) Foreign Application Priority Data
Nov. 18, 2015 (JP) .................... 2015-225748

(51) Int. Cl.
*B65H 7/14* (2006.01)
*G01D 5/347* (2006.01)
(Continued)

(52) U.S. Cl.
CPC .......... *B65H 7/14* (2013.01); *B65H 5/06* (2013.01); *G01D 5/3473* (2013.01); *H03K 5/08* (2013.01);
(Continued)

(58) Field of Classification Search
CPC ... B65H 7/00; B65H 7/02; B65H 7/14; B65H 2553/51
(Continued)

(56) References Cited

U.S. PATENT DOCUMENTS 4,061,326 A * 12/1977 Proudman .............. B65H 45/10
493/14
8,847,185 B2 * 9/2014 Theis ................... G05B 19/404
250/548
(Continued)

FOREIGN PATENT DOCUMENTS

JP          2-213216 A      8/1990
JP          2-265315 A     10/1990
(Continued)

OTHER PUBLICATIONS

Office action dated Jan. 31, 2017 in corresponding Japanese Patent Application No. 2015-225748, including part. Eng. translation, 6pp.
(Continued)

*Primary Examiner* — Thomas A Morrison
(74) *Attorney, Agent, or Firm* — Lewis Roca Rothgerber Christie LLP

(57) ABSTRACT

A document conveying apparatus includes a light source, a disk including a plurality of slits spaced apart with a predetermined interval in a rotation direction of the disk, which rotates in the rotation direction with a rotation speed as a document is conveyed, a light reception element provided at a position facing the light source with the disk interposed therebetween, a first signal generator for generating a first signal in accordance with light received by the light reception element, a second signal generator for generating a second signal obtained by removing, from the first signal, a noise component according to the rotation speed of the disk, and a controller for determining whether a document is conveyed by comparing the second signal with a predetermined threshold value.

5 Claims, 13 Drawing Sheets

(51) Int. Cl.
*B65H 5/06* (2006.01)
*H03K 5/08* (2006.01)
*H03K 5/1252* (2006.01)

(52) U.S. Cl.
CPC ........ *H03K 5/1252* (2013.01); *B65H 2511/52* (2013.01); *B65H 2515/60* (2013.01); *B65H 2553/412* (2013.01)

(58) Field of Classification Search
USPC .................................... 271/258.01, 265.01
See application file for complete search history.

(56) References Cited

U.S. PATENT DOCUMENTS

2006/0039736 A1* 2/2006 Ogawa ..................... B41J 11/42
400/582
2008/0237969 A1* 10/2008 Totsuka ................... B65H 3/06
271/109

FOREIGN PATENT DOCUMENTS

| JP | 4-140451 A | 5/1992 |
| JP | 2004-228625 A | 8/2004 |
| JP | 2012-247340 A | 12/2012 |

OTHER PUBLICATIONS

Chinese Office Action dated Jun. 22, 2018 regarding Chinese Patent No. 201610607233.7 corresponding to U.S. Appl. No. 15/174,893 (5 pages) with English Translation (6 pages).

* cited by examiner

DOCUMENT CONVEYING APPARATUS, DETERMINATION METHOD, AND COMPUTER-READABLE, NON-TRANSITORY MEDIUM

CROSS-REFERENCE TO RELATED APPLICATIONS

This application is based upon and claims the benefit of priority of prior Japanese Patent Application No. 2015-225748, filed on Nov. 18, 2015, the entire contents of which are incorporated herein by reference.

TECHNICAL FIELD

Embodiments discussed in the present specification relate to document conveying technology.

BACKGROUND

In general, a document conveying apparatus such as a scanner has a function of determining whether a document is conveyed or not by using an optical encoder, and when a document is not conveyed even though a motor is driven, a jam is determined to have occurred and the operation of the apparatus is stopped. The encoder includes a disk formed with many slits (transmission holes for light) and configured to rotate as a document is conveyed, and a light source and a light reception element provided to face each other with the disk interposed therebetween. The light reception element outputs an electric signal according to the received light quantity. The document conveying apparatus measures a document conveying quantity by measuring the number of times of changes between a state in which there exists a slit between the light source and the light reception element and a state in which a slit does not exist and the light is obstructed by the disk based on the electric signal, and determines whether a document is conveyed or not.

For example, the document conveying apparatus compares the electric signal that is output by the light reception element with a fixed threshold value, thus determining whether there is any change between a state in which there exists a slit between the light source and the light reception element and a state in which a slit does not exist and the light is obstructed by the disk. However, due to the light emitted from the light source and leaked out from the portions other than the slits of the disk, noise component may be overlaid on the electric signal that is output by the light reception element. In that case, even though a document is conveyed and accordingly the disk is rotating, the electric signal that is output by the light reception element may become equal to or more than fixed threshold value, or equal to or less than the fixed threshold value at all times, and this may make it impossible to correctly determine a change in the state of the slit.

A rotation angle detection apparatus for determining the rotation angle of a crank shaft of an internal combustion engine is disclosed (see Japanese Laid-open Patent Publication No. H4-140451). This rotation angle detection apparatus includes a disk rotating in synchronization with the crank shaft, multiple magnetic protrusions arranged with a regular interval along a circumference of the disk, an electromagnetic-type pickup arranged to face the rotation surface of the disk and face the magnetic protrusions, and a waveform shaping circuit. The waveform shaping circuit integrates the level of the output signal of the electromagnetic-type pickup, and generates a reference voltage that follows the frequency of the pulsation noise component. This reference voltage is a median value of an alternating current signal obtained by combining the original output signal and the pulsation noise component. The waveform shaping circuit compares the output signal and the reference voltage, and generates a square wave in which the effect based on the pulsation noise component is alleviated, and the rotation angle detection apparatus determines the rotation angle of the crank shaft based on the square wave.

A waveform shaping method of a signal of a non-contact-type speed detection apparatus that uses a non-contact displacement sensor and a rotation body having a toothed wheel or formed with protrusions and recesses to detect the number of revolutions and the rotation speed of the rotation body is disclosed (see Japanese Laid-open Patent Publication No. H2-265315). In this method, with respect to a source signal having an alternating current component overlaid on a direct current component, a signal in which the phase of the main waveform of the alternating current component of this source signal is configured to be different is compared while the levels of the direct current components in both signals are configured to be the same, so that a square signal that matches a cycle of the main waveform of the alternating current signal is generated.

SUMMARY

With the recent reduction in the size of document conveying apparatuses, the encoder is also required to be smaller. However, when the encoder is smaller, the slits provided in the disk become smaller accordingly, and therefore, the transmission performance (transmission light quantity) of the slits is reduced, and this reduces the light reception level of the light reception element when the light emitted from the light source passes through the slit. On the other hand, when the light shielding wall of the disk is thinner, the light shielding performance provided by the disk is reduced, and the leaked light quantity leaked from the portions other than the slits increases, and this increases the light reception level of the light reception element when the light emitted from the light source is shielded by the disk.

On the other hand, each document conveying apparatus varies in the characteristics of the encoder component, the shape, or the apparatus assembly. The variation in the characteristics is, for example, variations in the light emission efficiency of the light source, the light reception sensitivity of the light reception element, etc. The variation in the shape is, for example, variations in the thickness and the size of the disk, or the size, the interval, presence/absence of blurs, etc., of the slit. The variation in the apparatus assembly is, for example, variations of the shape of the rotation shaft of the disk, the state in which the disk is supported, etc.

When the encoder is smaller, the document conveying apparatus is susceptible to a change in the light reception level of the light reception element due to the variation in the characteristics of each encoder component, the shape, or the apparatus assembly, and the document conveying apparatus is more likely to be unable to correctly determine the change in the state of the slit. In that case, in order to suppress variation, a high level of quality is required for the apparatus assembly work, and accordingly, this increases the steps related to the apparatus assembly work. For this reason, the determination accuracy for determining a change in the state of the slit is desired to be further improved, so that a determination can be made correctly as to whether a document is conveyed even if the difference decreases between the light reception level when the light emitted from the light source passes through the slit and the light reception level when the light is shielded by the disk.

The object is to provide a document conveying apparatus, a determination method, and a computer-readable, non-transitory medium capable of determining whether a document is conveyed or not with a high degree of accuracy.

According to an aspect of the apparatus, there is provided a document conveying apparatus. The document conveying apparatus includes a light source, a disk including a plurality of slits spaced apart with a predetermined interval in a rotation direction of the disk, which rotates in the rotation direction with a rotation speed as a document is conveyed, a light reception element provided at a position facing the light source with the disk interposed therebetween, a first signal generator for generating a first signal in accordance with light received by the light reception element, a second signal generator for generating a second signal obtained by removing, from the first signal, a noise component according to the rotation speed of the disk, and a controller for determining whether a document is conveyed by comparing the second signal with a predetermined threshold value.

According to an aspect of the method, there is provided a determination method for a document conveying apparatus including a light source, a disk including a plurality of slits spaced apart with a predetermined interval in a rotation direction of the disk, which rotates in the rotation direction with a rotation speed as a document is conveyed, and a light reception element provided at a position facing the light source with the disk interposed therebetween. The determination method includes generating a first signal in accordance with light received by the light reception element, generating a second signal obtained by removing, from the first signal, a noise component according to the rotation speed of the disk, and determining whether a document is conveyed by comparing the second signal with a predetermined threshold value.

According to an aspect of the computer-readable, non-transitory medium storing a computer program, the computer program causes a document conveying apparatus which includes a light source, a disk including a plurality of slits spaced apart with a predetermined interval in a rotation direction of the disk, which rotates in the rotation direction with a rotation speed as a document is conveyed, and a light reception element provided at a position facing the light source with the disk interposed therebetween, to execute a process. The process includes generating a first signal in accordance with light received by the light reception element, generating a second signal obtained by removing, from the first signal, a noise component according to the rotation speed of the disk, and determining whether a document is conveyed by comparing the second signal with a predetermined threshold value.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Hereinafter, a document conveying apparatus according to an embodiment, will be described with reference to the drawings. However, it should be noted that the technical scope of the invention is not limited to these embodiments, and extends to the inventions described in the claims and their equivalents.

Figure 1:
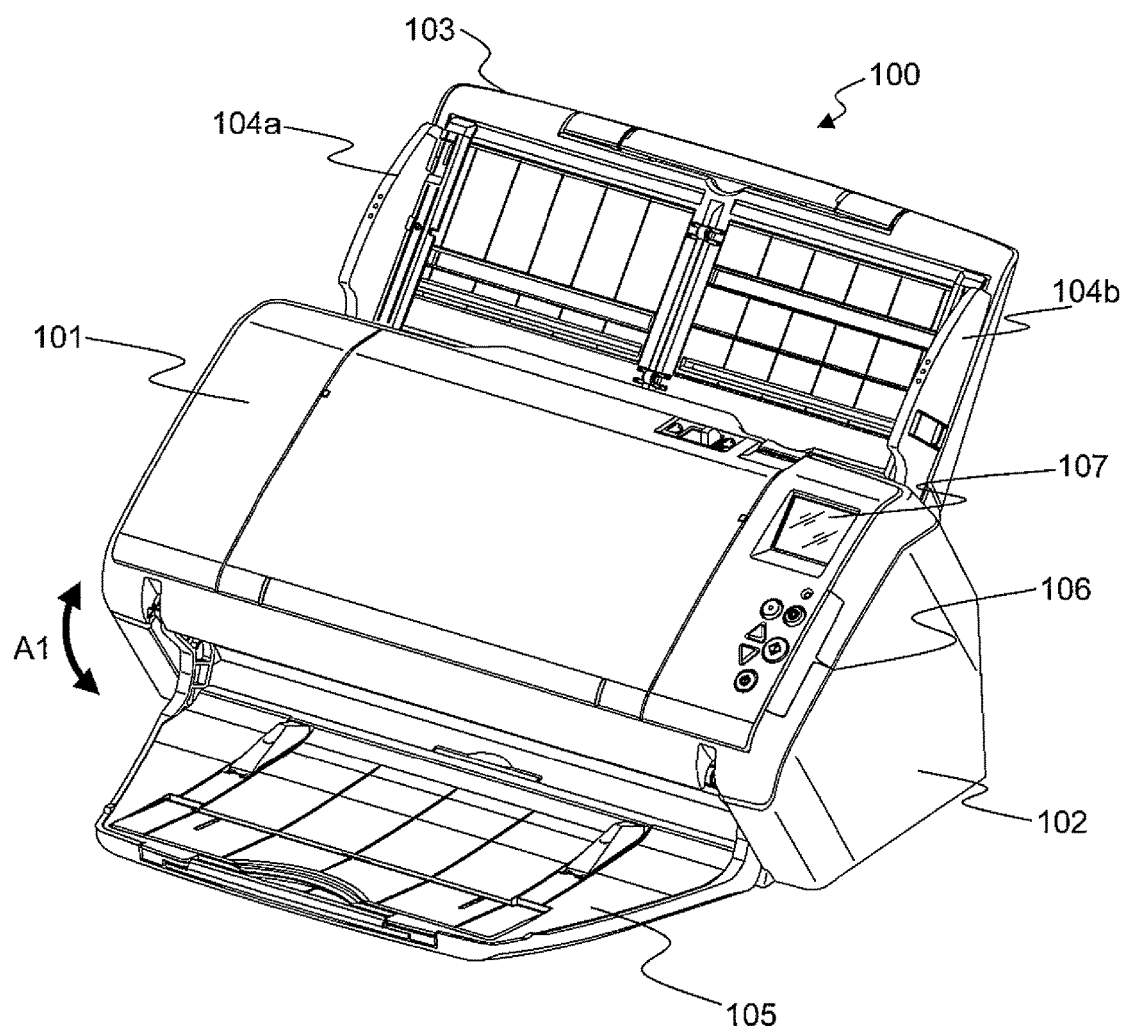
FIG. 1 is a perspective view illustrating a document conveying apparatus 100 according to an embodiment.

FIG. 1 is perspective view illustrating a document conveying apparatus 100 configured as an image scanner according to an embodiment.

The document conveying apparatus 100 is an example of an image reading apparatus. The document conveying apparatus 100 includes an upper side housing 101, a lower side housing 102, a document tray 103, a discharged sheet stacker 105, multiple operation buttons 106, a display device 107, etc.

The upper side housing 101 is arranged at a position to cover the upper surface of the document conveying apparatus 100, and is attached to the lower side housing 102 with a hinge so as to be able to open and close, at the time of a paper jam, at the time of cleaning of the document conveying apparatus 100, etc.

The document tray 103 is engaged with the lower side housing 102 in such a manner that the document can be placed on the document tray 103. The document tray 103 is provided with side guides 104a and 104b which can move in a direction perpendicular to the conveying direction of the document. Hereinafter, the side guides 104a and 104b may be collectively referred to as side guides 104.

The discharged sheet stacker 105 is attached to the lower side housing 102 with a hinge in such a manner that the discharged sheet stacker 105 can pivot in a direction indicated by arrow A1, and in the open state as depicted in FIG. 1, the discharged sheet stacker 105 can hold the discharged documents.

Each of the multiple operation buttons 106 is arranged on the surface of the upper side housing 101, and when the operation button 106 is pressed down, the operation button 106 generates and outputs an operation detection signal in accordance with the button.

The display device 107 includes a display constituted by a liquid crystal, an organic EL (Electro-Luminescence), etc., and an interface circuit for outputting image data to the display, and displays the image data to the display.

Figure 2:
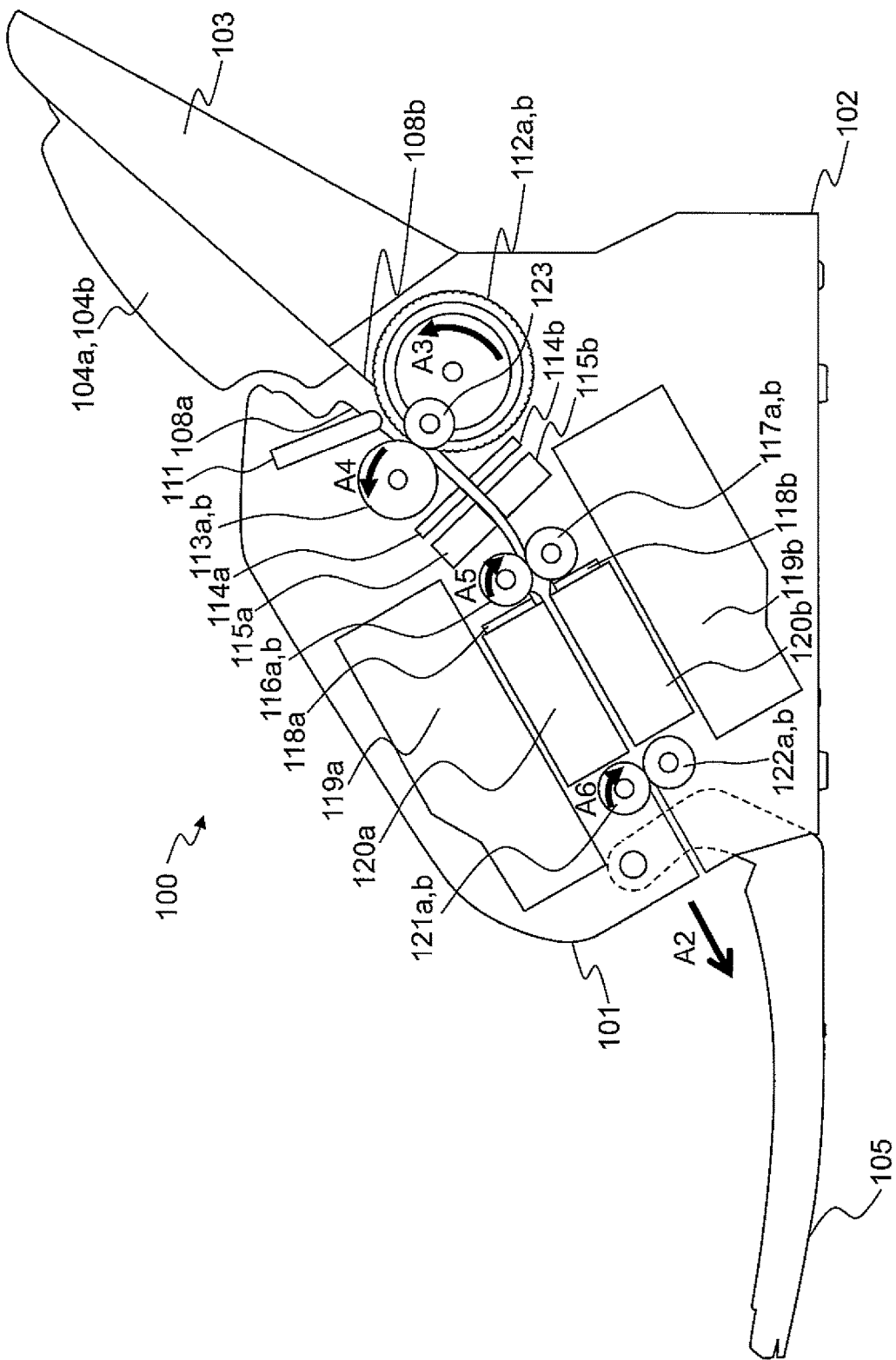
FIG. 2 is a figure for explaining a conveying path inside of the document conveying apparatus 100.

FIG. 2 is a figure for explaining a conveying path inside of the document conveying apparatus 100.

The conveying path inside of the document conveying apparatus 100 includes a contact sensor 111, feeding rollers 112a, 112b, brake rollers 113a, 113b, an encoder driven roller 123, a first light emitter 114a, a first light receiver 114b, an ultrasonic transmitter 115a, an ultrasonic receiver 115b, first conveying rollers 116a, 116b, first driven rollers 117a, 117b, a second light emitter 118a, a second light receiver 118b, a first image capturing device 119a, a second image capturing device 119b, a first illumination device 120a, a second illumination device 120b, second conveying rollers 121a, 121b, second driven rollers 122a, 122b, etc.

In the following explanation, the feeding rollers 112a and 112b may be collectively referred to as the feeding roller 112. The brake rollers 113a and 113b may be collectively referred to as the brake roller 113. The first conveying rollers 116a and 116b may be collectively referred to as the first conveying roller 116. The first driven rollers 117a and 117b may be collectively referred to as the first driven roller 117. The second conveying rollers 121a and 121b may be collectively referred to as the second conveying roller 121. The second driven rollers 122a and 122b may be collectively referred to as the second driven roller 122.

The lower surface of the upper side housing 101 forms a upper side guide 108a of the conveying route for the documents, and the upper surface of the lower side housing 102 forms an lower side guide 108b of the conveying route for the documents. In FIG. 2, arrow A2 indicates the conveying direction of the documents. In the following explanation, the upstream means the upstream in the conveying direction A2 of the documents, and the downstream means the downstream in the conveying direction A2 of the documents.

The contact sensor 111 is provided at the upstream side with respect to the feeding roller 112 and the brake roller 113, and detects whether or not a document is placed on the document tray 103. The contact sensor 111 generates and outputs a first document detection signal of which signal value changes depending on a state in which the document is placed on the document tray 103 and a state in which the document is not placed on the document tray 103.

The first light emitter 114a and the first light receiver 114b are provided at the downstream side with respect to the feeding roller 112 and the brake roller 113 and at the upstream side with respect to the first conveying roller 116 and the first driven roller 117, and are arranged to face each other with the conveying route for the documents interposed therebetween. The first light emitter 114a emits light to the first light receiver 114b. The first light receiver 114b detects light emitted from the first light emitter 114a, and generates and outputs a second document detection signal which is an electric signal according to the detected light. More specifically, the second document detection signal is a signal of which the value changes depending on a state in which a document exists between the first light emitter 114a and the first light receiver 114b and a state in which a document does not exist between the first light emitter 114a and the first light receiver 114b. Hereinafter, the first light emitter 114a and the first light receiver 114b may be collectively referred to as the first light sensor 114.

The ultrasonic transmitter 115a and the ultrasonic receiver 115b are arranged in proximity to the conveying route for the documents so as to face each other with the conveying route interposed therebetween. The ultrasonic transmitter 115a transmits an ultrasonic wave. On the other hand, the ultrasonic receiver 115b detects the ultrasonic wave that has been transmitted by the ultrasonic transmitter 115a and that has passed through a document, and generates and outputs an ultrasonic signal which is an electric signal according to the detected ultrasonic wave. In the following explanation, the ultrasonic transmitter 115a and the ultrasonic receiver 115b may be collectively referred to as the ultrasonic sensor 115.

The second light emitter 118a and the second light receiver 118b are provided at the downstream side with respect to the first conveying roller 116 and the first driven roller 117 and provided at the upstream side with respect to the first image capturing device 119a and the second image capturing device 119b, and are arranged to face each other with the conveying route for the documents interposed therebetween. The second light emitter 118a emits light to the second light receiver 118b. The second light receiver 118b detects light emitted from the second light emitter 118a, and generates and outputs a third document detection signal which is an electric signal according to the detected light. More specifically, the third document detection signal is a signal of which signal value changes depending on a state in which a document exists between the second light emitter 118a and the second light receiver 118b and a state in which a document does not exist between the second light emitter 118a and the second light receiver 118b. Hereinafter, the second light emitter 118a and the second light receiver 118b may be collectively referred to as the second light sensor 118.

The first image capturing device 119a includes an image capturing sensor of a reduced optical system type having an image capturing device based on CCD (Charge Coupled Device) arranged in a linear manner in a main scanning direction. This image capturing sensor reads the back surface of the conveyed document, and generates and outputs an analog image signal. Likewise, the second image capturing device 119b includes an image capturing sensor of a reduced optical system type based on CCD arranged in the linear manner in the main scanning direction. This image capturing sensor generates and outputs an analog image signal by reading the front surface of the conveyed document. It should be noted that only one of the first image capturing device 119a and the second image capturing device 119b may be provided to read only one of the surfaces of a document. Alternatively, it may possible to use a CIS (Contact Image Sensor) of the same-size optical system type having an image capturing device based on CMOS (Complementary Metal Oxide Semiconductor) instead of the CCD. Hereinafter, the first image capturing device 119a and the second image capturing device 119b may be collectively referred to as the image capturing device 119.

The first illumination device 120a includes a light source for illuminating the back surface of a document and a backing that is used for the front surface of the document, and is arranged at a position between the first image capturing device 119a and the document conveying route so that the first illumination device 120a faces the second image capturing device 119b. Likewise, the second illumination device 120b includes a light source for illuminating the front surface of a document and a backing that is used for the back surface of the document, and is arranged at a position between the second image capturing device 119b and the document conveying route so that the second illumination device 120b faces the first image capturing device 119a. Hereinafter, the first illumination device 120a and the second illumination device 120b may be collectively referred to as the illumination device 120.

When the feeding roller 112 rotates in the direction indicated by arrow A3 of FIG. 2, the document placed on the document tray 103 is conveyed between the upper side guide 108a and the lower side guide 108b in the document conveying direction A2. While the document is conveyed, the brake roller 113 rotates in the direction of the arrow A4 of FIG. 2. When multiple documents are placed on the document tray 103, only one of the documents placed on the document tray 103 that is in contact with the feeding roller 112 is separated with the action of the feeding roller 112 and the brake roller 113. Therefore, this operates so as to limit the conveying of a document other than the separated document (prevention of multifeed). The feeding roller 112 and the brake roller 113 functions as a separation module for a document.

The document is fed between the first conveying roller 116 and the first driven roller 117 while the document is guided by the upper side guide 108a and the lower side guide 108b. When the first conveying roller 116 rotates in the direction of the arrow A5 of FIG. 2, the document is fed between the first image capturing device 119a and the second image capturing device 119b. When the second conveying roller 121 rotates in the direction of the arrow A6 of FIG. 2, the document, which has been read by the image capturing device 119, is discharged onto the discharged sheet stacker 105.

Figure 3:
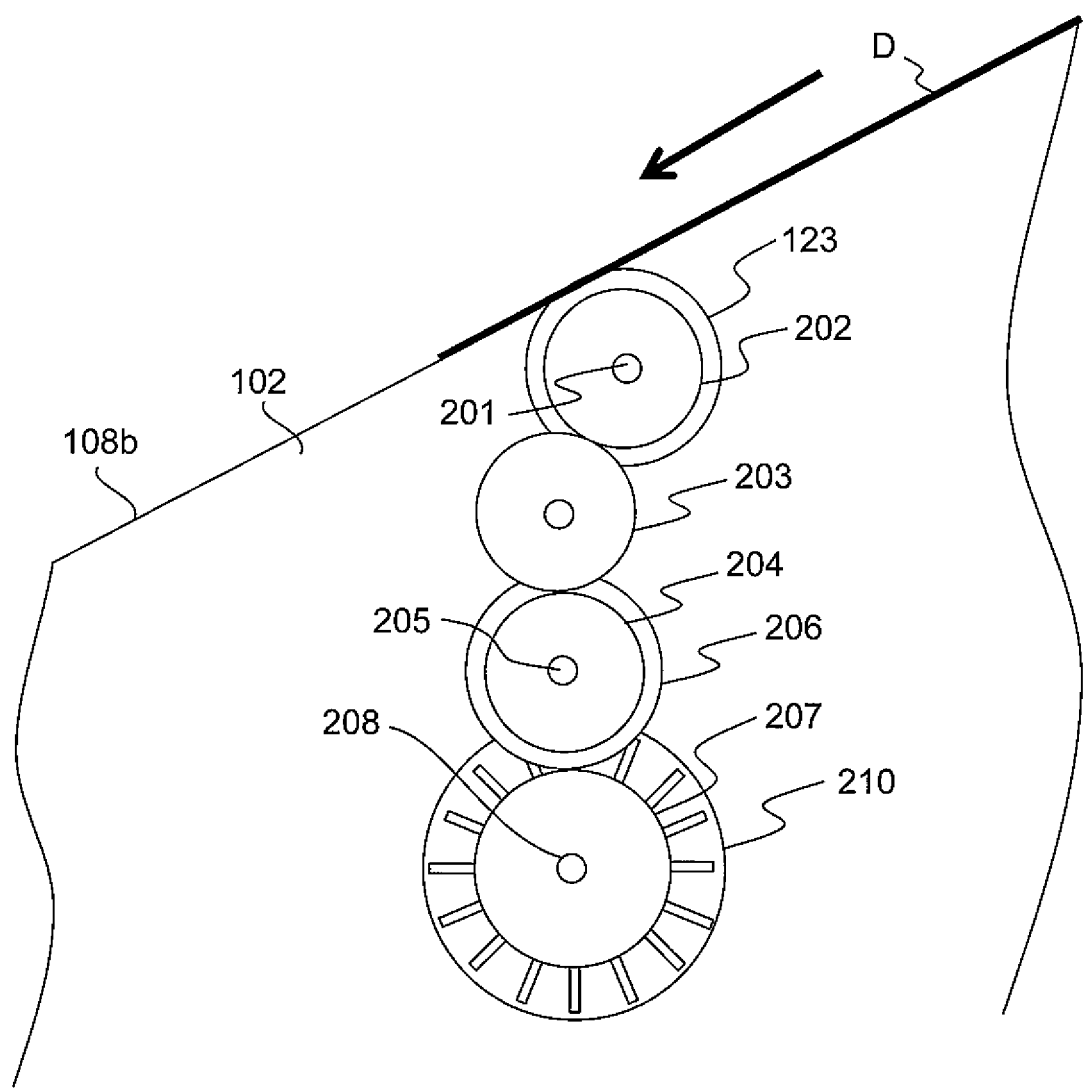
FIG. 3 is a schematic diagram for explaining an arrangement of a disk 210.

FIG. 3 is a schematic diagram for explaining an arrangement of a disk 210.

As shown in FIG. 3, the document conveying apparatus 100 includes, inside of a lower side housing 102, not only an encoder driven roller 123 but also a first rotation shaft 201, a first gear 202, a second gear 203, a third gear 204, a second rotation shaft 205, a fourth gear 206, a fifth gear 207, a third rotation shaft 208, a disk 210, etc.

The encoder driven roller 123 is attached to the first rotation shaft 201, and the first gear 202 is further attached to the first rotation shaft 201. The first gear 202 is engaged with the second gear 203, and the second gear 203 is engaged with the third gear 204. The third gear 204 is attached to the second rotation shaft 205, and the fourth gear 206 is further attached to the second rotation shaft 205. The fourth gear 206 is engaged with the fifth gear 207. The fifth gear 207 is attached to the third rotation shaft 208. The disk 210 is further attached to the third rotation shaft 208.

When a document is conveyed along the lower side guide 108b, the encoder driven roller 123 as the document is conveyed. As the encoder driven roller 123 rotates, the first rotation shaft 201, the first gear 202, the second gear 203, the third gear 204, the second rotation shaft 205, the fourth gear 206, the fifth gear 207, and the third rotation shaft 208 rotate, and further, the disk 210 rotates.

Figure 4:
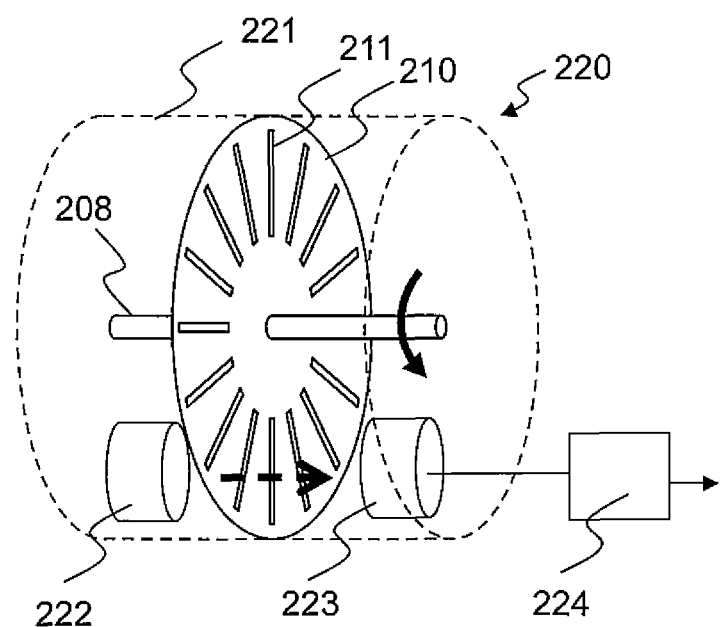
FIG. 4 is a schematic diagram for explaining a conveying sensor 220.

FIG. 4 is a schematic diagram for explaining a conveying sensor 220.

The conveying sensor 220 is an encoder for measuring the document conveying quantity, and as shown in FIG. 4, the conveying sensor 220 includes not only the third rotation shaft 208 and the disk 210 but also the housing 221, the light source 222, the light reception element 223, the conveyance signal generation circuit 224, etc.

The housing 221 has a substantially cylindrical shape. The disk 210, the light source 222, and the light reception element 223 are arranged in the inside of the housing 221.

The light source 222 is arranged at the position facing the light reception element 223 with the disk 210 interposed therebetween, and is configured to emit light to the disk 210 and the light reception element 223.

The disk 210 is a flat-shaped disk made of resin. The disk 210 includes a plurality of slits 211 formed to pass light emitted from the light source 222. The plurality of slits 211 are spaced apart with a predetermined interval in the rotation direction of the disk. The disk 210 rotates in the rotation direction with a rotation speed as a document is conveyed.

The light reception element 223 is arranged at the position facing the light source 222 with the disk 210 interposed therebetween, and is configured to receive light that is emitted from the light source 222 and that has passed through the slit 211.

The conveyance signal generation circuit 224 generates and outputs a conveyance signal which is an electric signal according to the light received by the light reception element 223. The conveyance signal is an example of a first signal, and the conveyance signal generation circuit 224 is an example of a first signal generator.

The disk 210, the light source 222, and the light reception element 223 are covered with the housing 221, so that the light emitted from the light source 222 is not diffracted around the outside of the disk 210, and is not received by the light reception element 223. However, it is difficult to completely shield the light diffracted around the outside of the disk 210, and some of the light emitted from the light source 222 is diffracted around the outside of the disk 210 and received by the light reception element 223. Since the disk 210 is made of resin, some of the light emitted from the light source 222 passes through portions other than the slits 211 of the disk 210, and the light is received by the light reception element 223.

Figure 5:
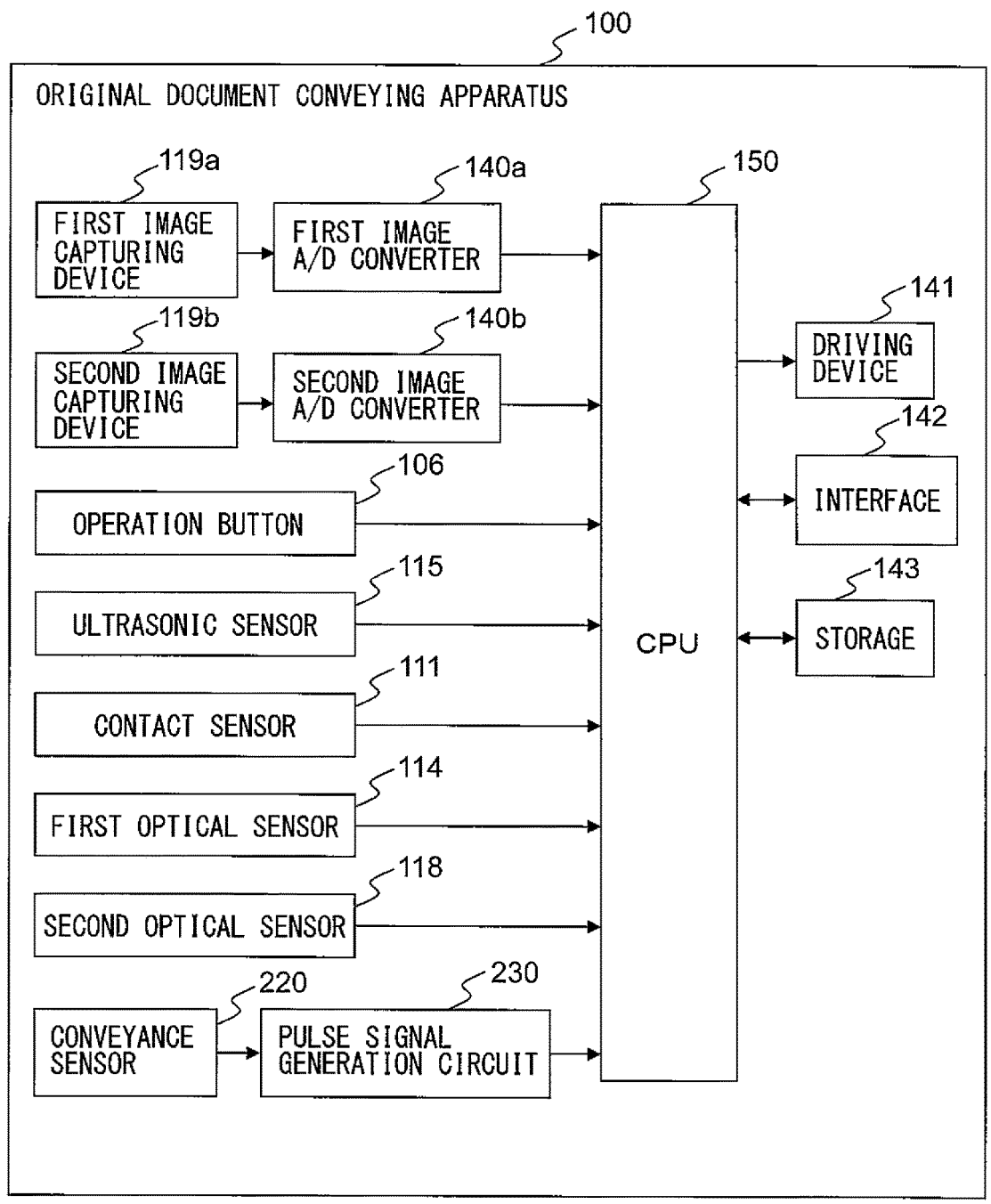
FIG. 5 is a block diagram illustrating a schematic configuration of the document conveying apparatus 100.

FIG. 5 is a block diagram illustrating a schematic configuration of the document conveying apparatus 100.

The document conveying apparatus 100 includes not only the configuration described above but also a first A/D convertor 140a, a second A/D convertor 140b, a pulse signal generation circuit 230, a driving apparatus 141, an interface 142, a storage 143, a CPU (Central Processing Unit) 150, etc.

The first A/D converter 140a performs analog digital conversion to convert an analog image signal which is output from the first image capturing device 119a, and generate digital image data, and outputs the digital image data to the CPU 150. Likewise, the second A/D converter 140b performs analog digital conversion to convert an analog image signal which is output from the second image capturing device 119b, and generate digital image data, and outputs the digital image data to the CPU 150. These digital image data are used as read image. Hereinafter, the first A/D converter 140a and the second A/D converter 140b may be collectively referred to as the A/D converter 140.

The pulse signal generation circuit 230 receives a conveyance signal which is output by the conveying sensor 220, and generates a pulse signal for measuring the document conveying quantity from the received conveyance signal, and outputs the pulse signal to the CPU 150.

The driving device 141 includes one or more motors, and in accordance with a control signal from the CPU 150, the one or more motors rotate the feeding roller 112, the brake roller 113, the first conveying roller 116, and the second conveying roller 121 to perform conveying operation of the documents.

The interface 142 includes, for example, an interface circuit based on a serial bus such as USB, and electrically connects with an information processing apparatus, not shown (for example, a personal computer, a portable information terminal, etc.), and transmits and receives read images and various kinds of information. Instead of the interface 142, an antenna for transmitting and receiving a wireless signal and a communication module having a wireless communication interface circuit for transmitting and receiving a signal via a wireless communication circuit in accordance with a predetermined communication protocol may be used. The predetermined communication protocol may be, for example, a wireless LAN (Local Area Network).

The storage 143 includes memory devices such as a RAM (Random Access Memory), a ROM (Read Only Memory), etc., a fixed disk device such as a hard disk, or a portable storage device such as a flexible disk, an optical disk, etc. The storage 143 stores computer programs, databases, tables, etc., used for various kinds of processing of the document conveying apparatus 100. The computer program may be installed on the storage 143 from a computer-readable, non-transitory medium such as a compact disk read only memory (CD-ROM), a digital versatile disk read only memory (DVD-ROM), etc., by using a well-known setup program, etc. Further, the storage 143 stores the read images.

The CPU 150 is an example of a controller. The CPU 150 operates based on a program stored in the storage 143 in advance. Alternatively, a DSP (digital signal processor), an LSI (large scale integration), etc., may be used instead of the CPU 150. As another alternative, an ASIC (Application Specific Integrated Circuit), an FPGA (Field-Programming Gate Array), etc., may be used instead of the CPU 150.

The CPU 150 is connected to the operation button 106, the contact sensor 111, the first light sensor 114, the ultrasonic sensor 115, the second light sensor 118, the first image capturing device 119*a*, the second image capturing device 119*b*, the first A/D converter 140*a*, the second A/D converter 140*b*, the pulse signal generation circuit 230, the driving device 141, the interface 142, the storage 143, the backing driving device 231, etc., and controls each of these modules. The CPU 150 performs driving control of the driving device 141, document reading control of the image capturing device 119, etc., and obtains read images.

Figure 6:
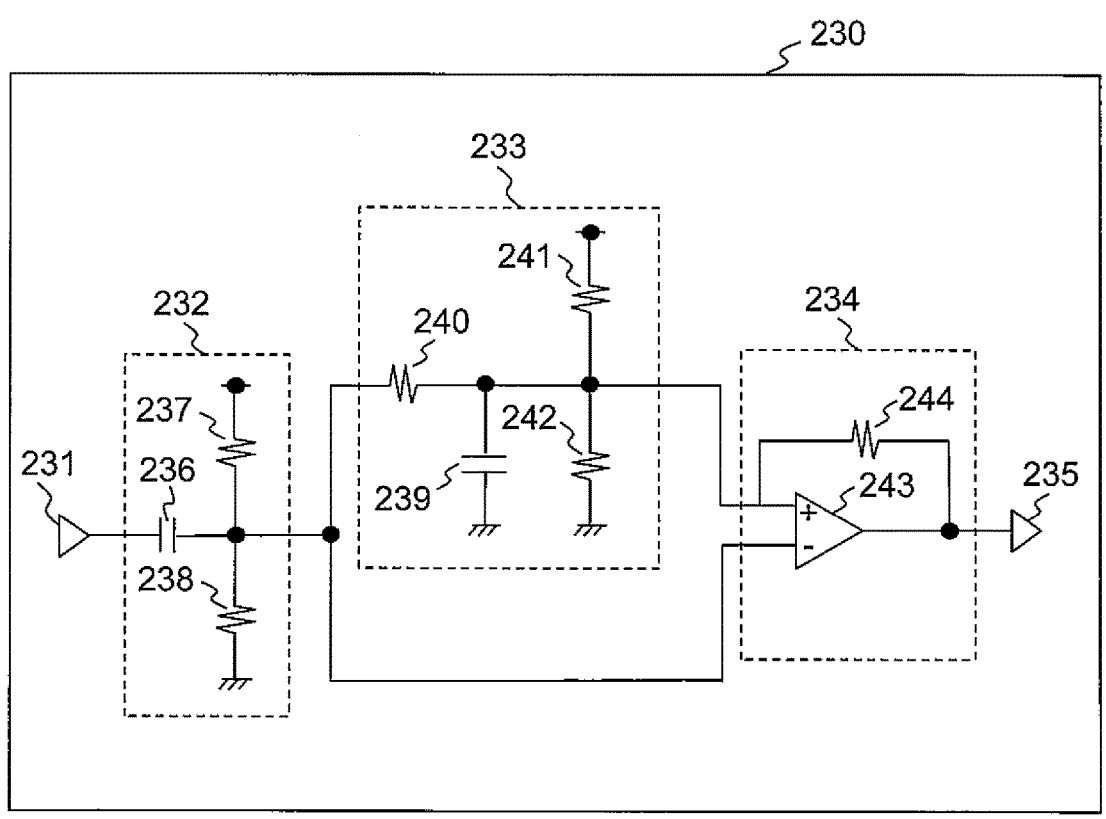
FIG. 6 is a circuit diagram constituting a pulse signal generation circuit 230.

FIG. 6 is an example of a circuit diagram constituting the pulse signal generation circuit 230.

As shown in FIG. 6, the pulse signal generation circuit 230 includes a low frequency component removing circuit 232, a delay circuit 233, a comparison circuit 234, etc.

The input terminal 231 is connected to the conveying sensor 220 and the low frequency component removing circuit 232, and is configured to input the conveyance signal, which is output from the conveying sensor 220, into the low frequency component removing circuit 232. The output terminal of the low frequency component removing circuit 232 is connected to the input terminal of the delay circuit 233 and the second input terminal of the comparison circuit 234, and is configured to input the signal, which is output from the low frequency component removing circuit 232, into the delay circuit 233 and the comparison circuit 234. The output terminal of the delay circuit 233 is connected to the first input terminal of the comparison circuit 234, and inputs the signal, which is output from the delay circuit 233, into the comparison circuit 234. The output terminal 235 is connected to the comparison circuit 234 and the CPU 150, and is configured to input the signal, which is output from the comparison circuit 234, into the CPU 150.

The low frequency component removing circuit 232 includes a capacitor 236 and resistors 237, 238. While the capacitor 236 removes a noise component (low frequency component) of the input conveyance signal, the resistors 237, 238 adjust the bias voltage given to the output signal.

A noise component is overlaid on the conveyance signal because of the light emitted from the light source 222 and leaked out from those other than the slits 211 of the disk 210. This noise component is generated as the disk 210 rotates, and the noise component changes in accordance with the rotation speed of the disk 210. In particular, this noise component changes in synchronization with a rotation cycle in which the disk 210 makes a single turn. As a result of measurement performed by using the document conveying apparatus 100, it is understood that this noise component has a frequency of about one to four times the rotation frequency, which is the reciprocal number of the rotation cycle of the disk 210.

The low frequency component removing circuit 232 removes the noise component according to the rotation speed of the disk 210 from the conveyance signal. The noise component to be removed is determined based on the rotation speed of the disk 210 and/or the number of slits. For example, the noise component to be removed is determined to be a component of a frequency equal to or more than one time and equal to or less than four times the rotation frequency of the disk 210 based on the above measurement result. The rotation cycle of the disk 210 is a value obtained by multiplying the cycle, from when each slit is at the facing position of the disk 210 to when a slit adjacent to that slit moves to the facing positon, by the number of slits 211 formed in the disk 210. Therefore, the noise component to be removed can also be calculated based on the movement cycle of the slit and the number of slits. The capacity of the capacitor 236 and the resistance values of the resistors 237, 238 are set to values, so that, while this noise component is removed, other components are attenuated.

A direct current component, which is different depending on individual difference of each encoder component, is overlaid on the conveyance signal. The frequency of this direct current component is lower than the frequency of the noise component, and therefore, the low frequency component removing circuit 232 can remove not only the noise component but also the direct current component with the capacitor 236 and the resistors 237, 238.

Hereinafter, the signal which is output from the low frequency component removing circuit 232 and from which the noise component has been removed may be referred to as a noise-removed signal. The noise-removed signal is an example of a second signal, and the low frequency component removing circuit 232 is an example of a second signal generator.

The delay circuit 233 includes a capacitor 239 and resistors 240, 241, 242. While the capacitor 239 and the resistor 240 delays the received noise-removed signal by a predetermined period of time, the resistors 241, 242 adjust the bias voltage given to the signal, which is to be output.

The signal which is output by the delay circuit 233 is compared with the noise-removed signal and is used to determine whether there is any change in the noise-removed signal. Therefore, when the predetermined period of time by which the noise-removed signal is delayed is too long, it may be impossible to appropriately detect a change in the noise-removed signal, e.g., a change that occurs immediately after a document starts to be conveyed and the disk 210 starts to rotate. On the other hand, when the predetermined period of time is too short, it may be impossible to detect the change of the light caused by the rotation of the disk 210.

In a case where the delay circuit is achieved by a simple configuration such as the delay circuit 233, the amplitude of the signal obtained by delaying the noise-removed signal becomes smaller as the predetermined period of time by which the noise-removed signal is delayed is longer. For this reason, the predetermined period of time is preferably set to a range of 1% to 30% of the slit cycle, so that the amplitude of the signal obtained by delaying the noise-removed signal is included in the range of 5% to 50% of the amplitude of the noise-removed signal. For example, the capacity of the capacitor 239 and the resistance values of the resistors 240, 241, 242 are set to values so that the noise-removed signal is delayed by ⅛ of the slit cycle and the amplitude thereof becomes ½.

Hereinafter the signal which is output from the delay circuit 233 and which is obtained by delaying the noise-removed signal by the predetermined period of time may be referred to as a delayed signal.

The comparison circuit 234 includes a comparator 243 and a resistor 244. The comparator 243 generates a pulse signal representing a comparison result of the noise-removed signal and the delayed signal. The comparison circuit 234 feeds back the generated pulse signal to the input of the comparator 243 via the resistor 244, thereby reducing the effect of the noise in the generated pulse signal.

The pulse signal which is output from the comparison circuit 234 is used to measure the document conveying quantity by the CPU 150.

Figure 7A:
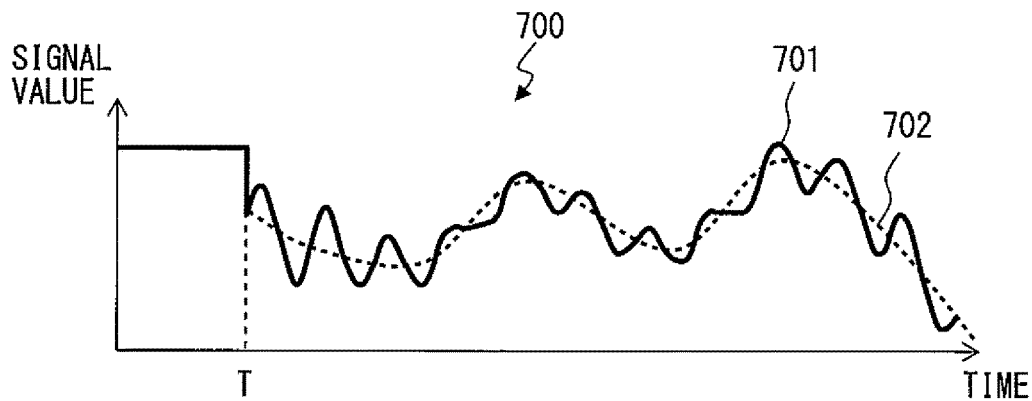
FIG. 7A is a graph illustrating an example of a conveyance signal.
Figure 7B:
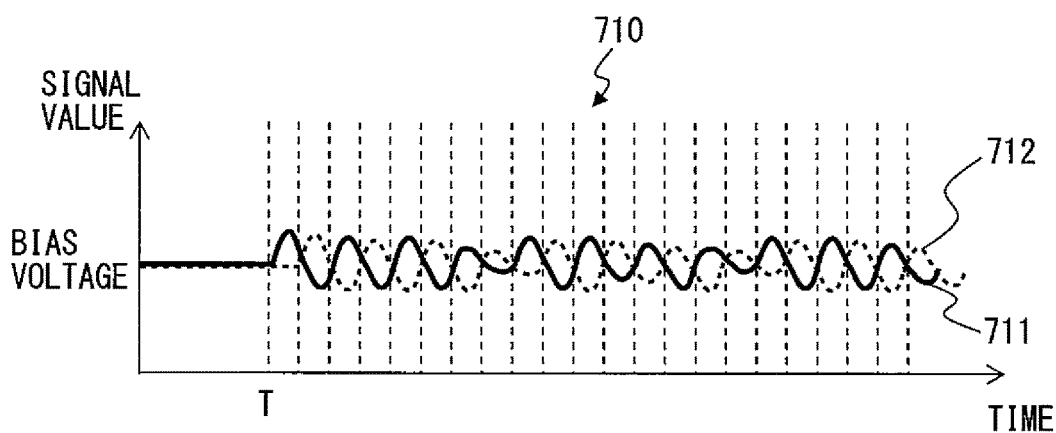
FIG. 7B is a graph illustrating an example of a noise-removed signal and delayed signal.
Figure 7C:
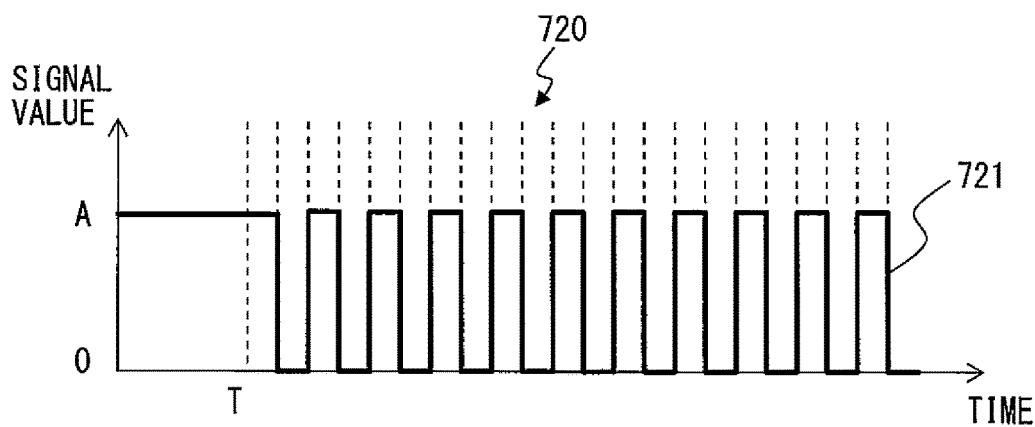
FIG. 7C is a graph illustrating an example of a pulse signal.

FIG. 7A is a graph 700 illustrating an example of a conveyance signal. FIG. 7B is a graph 710 illustrating an example of a noise-removed signal and a delayed signal. FIG. 7C is a graph 720 illustrating an example of a pulse signal.

The horizontal axis of the graphs 700, 710, and 720 indicates a time, and the vertical axis thereof indicates a signal value. The graphs 700, 710, and 720 indicate the signal values of the signals in the same time zone. More specifically, the graph 700 indicates a conveyance signal 701, and the graph 710 indicates a noise-removed signal 711 obtained by removing the noise component from the conveyance signal 701 and a delayed signal 712 obtained by delaying the noise-removed signal 711 by ½ of the slit cycle. The graph 720 indicates a pulse signal 721 representing a comparison result of the noise-removed signal 711 and the delayed signal 712. When the noise-removed signal 711 is more than the delayed signal 712, the signal value of the pulse signal 721 becomes a predetermined value A, and when the noise-removed signal 711 is less than the delayed signal 712, the signal value of the pulse signal 721 becomes zero.

In the graphs 700, 710, and 720, before a time T, a document is not conveyed, and the disk 210 is not rotating. Therefore, before the time T, the signal value of the conveyance signal 701 is indefinite depending on whether the slit 211 of the disk 210 is at a stop at the positon facing the light source 222 and the light reception element 223 or the slit 211 of the disk 210 is at a stop at the positon not facing the light source 222 and the light reception element 223. However, the low frequency component removing circuit 232 removes the direct current component of the conveyance signal 701 and adjusts the bias voltage given to the conveyance signal 701. Therefore, before the time T, the signal values of the noise-removed signal 711 and the delayed signal 712 are constant bias voltage values.

On the other hand, in the graphs 700, 710, and 720, at the time T, the document starts to be conveyed, and the disk 210 starts to rotate. Therefore, after the time T, the signal value of the conveyance signal 701 changes depending on whether the slit 211 of the disk 210 exists at the position facing the light source 222 and the light reception element 223 or not. Further, a low frequency noise component 702 is overlaid on the conveyance signal 701 because of the light which is emitted by the light source 222 and leaked out from the portions other than the slit 211 of the disk 210. However, the low frequency component removing circuit 232 removes the noise component 702 of the conveyance signal 701, and the low frequency component based on the noise component 702 is removed from the noise-removed signal 711 and the delayed signal 712.

As shown in FIG. 7C, when a document is not conveyed, the signal value of the pulse signal 721 stays at a fixed value, and when a document is conveyed, the signal value of the pulse signal 721 regularly switches between the predetermined value A and zero as the document is conveyed. Therefore, the document conveying apparatus 100 can correctly measure the document conveying quantity by using the pulse signal 721, and can accurately determine whether a document is conveyed or not.

Figure 8A:
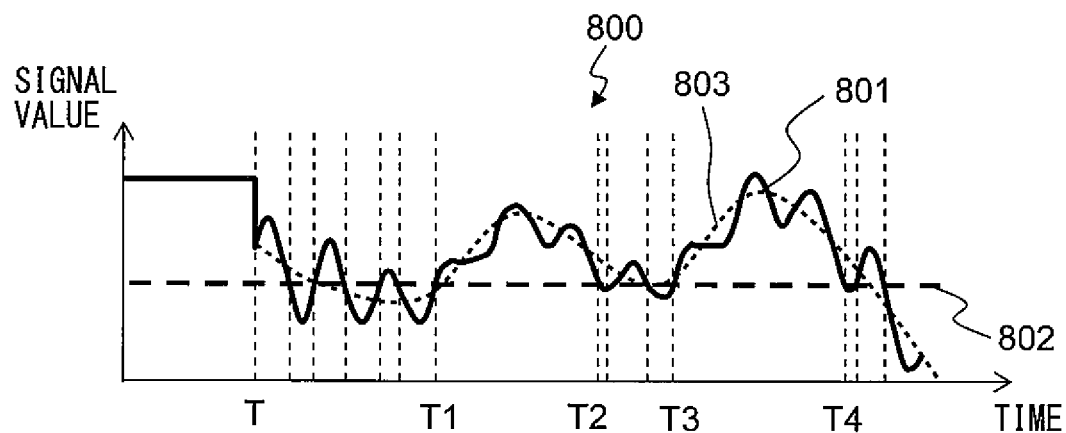
FIG. 8A is a graph for explaining a case where a noise component is not removed.
Figure 8B:
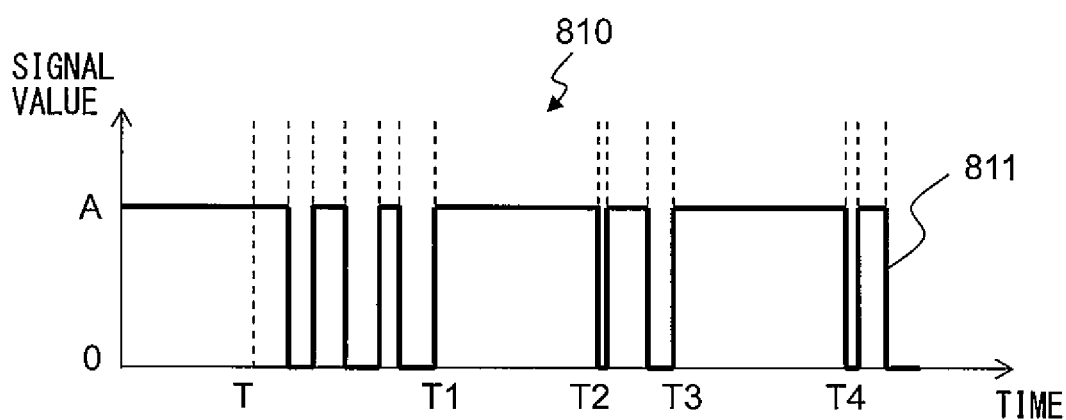
FIG. 8B is a graph for explaining a case where a noise component is not removed.

FIGS. 8A and 8B are graphs 800, 810 for explaining a case where a comparison is directly made with a fixed threshold value without removing any noise component from a conveyance signal.

The horizontal axis of the graphs 800 and 810 indicates a time, and the vertical axis thereof indicates a signal value. The graphs 800 and 810 indicate the signal values of the signals in the same time zone. The graph 800 indicates a conveyance signal 801 like the conveyance signal 701, and a fixed threshold value 802. The graph 810 indicates a signal 811 representing a comparison result between the conveyance signal 801 and the fixed threshold value 802. When the conveyance signal 801 is more than the fixed threshold value 802, the signal value of the pulse signal 811 becomes a predetermined value A, and when the conveyance signal 801 is less than the fixed threshold value 802, the signal value of the pulse signal 811 becomes zero.

Like the graphs 700 to 720, in the graphs 800 and 810, at the time T, a document starts to be conveyed, and the disk 210 starts to rotate. However, a low frequency noise component 803 is overlaid on the conveyance signal 801 because of the light which is emitted by the light source 222 and leaked out from the portions other than the slit 211 of the disk 210. Therefore, in the times T1 to T2 and the times T3 to T4, the signal value of the conveyance signal 801 is more than the fixed threshold value 802 at all times, and the signal value of the signal 811 does not change. Therefore, when the signal 811 is used, the document conveying apparatus 100 cannot correctly measure the document conveying quantity, and may incorrectly determine whether a document is conveyed or not.

Figure 9A:
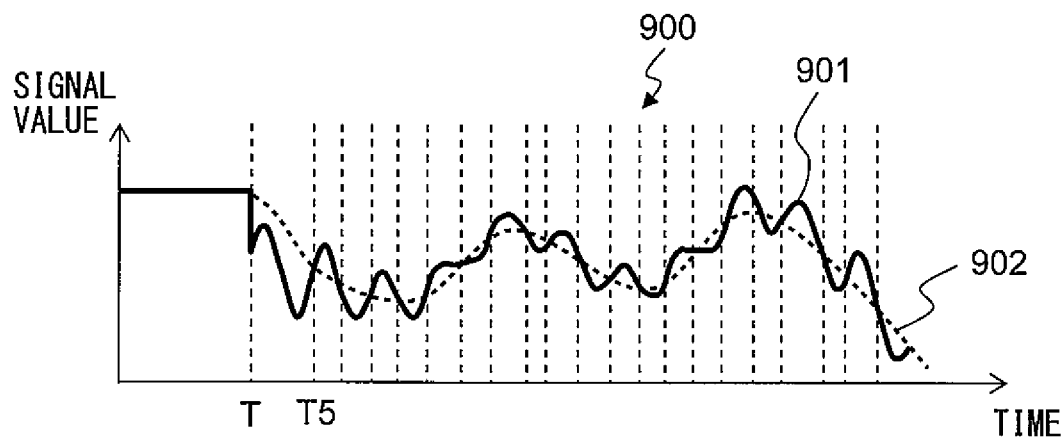
FIG. 9A is a graph for explaining a case where a noise component is not removed.
Figure 9B:
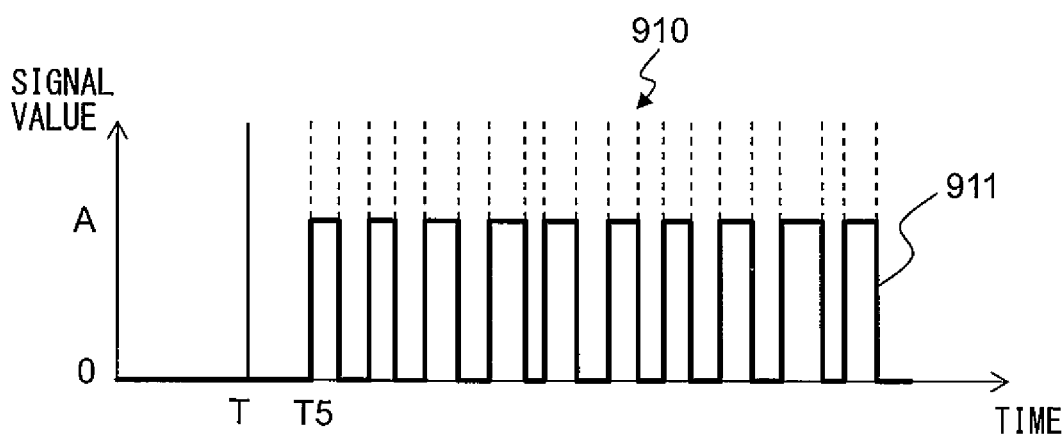
FIG. 9B is a graph for explaining a case where a noise component is not removed.

FIG. 9A, FIG. 9B are graphs 900, 910 for explaining a case where an average value of a conveyance signal in a predetermined period of time in the past is used as a threshold value for comparison without removing any noise component from a conveyance signal.

The horizontal axis of the graphs 900 and 910 indicates a time, and the vertical axis thereof indicates a signal value. The graphs 900 and 910 indicate the signal values of the signals in the same time zone. The graph 900 indicates a conveyance signal 901 like the conveyance signal 701 and an average value 902 of the signal value of the conveyance signal 901 in a predetermined period of time in the past. The graph 910 indicates a signal 911 representing a comparison result of the conveyance signal 901 and the average value 902. When the conveyance signal 901 is more than the average value 902, the signal value of the pulse signal 911 becomes a predetermined value A, and when the conveyance signal 901 is less than the average value 902, the signal value of the signal 911 becomes zero.

Like the graphs 700 to 720, in the graphs 900 and 910, at the time T, a document starts to be conveyed, and the disk 210 starts to rotate. The average value 902 changes so as to follow the signal value of the conveyance signal 901, and therefore, within the predetermined period of time, the signal value of the conveyance signal 901 is less likely to be larger than the average value 902 at all times and is less likely to be smaller than the average value 902 at all times.

However, at the times T to T5 immediately after a document starts to be conveyed and the disk 210 starts to rotate, the average value 902 is affected by the signal value of the conveyance signal 901 before the time T when the disk 210 was at a stop, and is unable to immediately follow the change of the conveyance signal 901. Therefore, depending on the state of the slit 211 when the disk 210 was at a stop, the signal value of the conveyance signal 901 may become smaller than the average value 902 at all times and may become larger than the average value 902 at all times in the times T to T5. In the example as shown in the graphs 900, 910, in the times T to T5, the signal value of the conveyance signal 901 is smaller than the average value 902 at all times, and the signal value of the signal 911 does not change. Therefore, when the signal 911 is used, it may take time for the document conveying apparatus 100 to be able to detect that the document is conveyed.

Figure 10A:
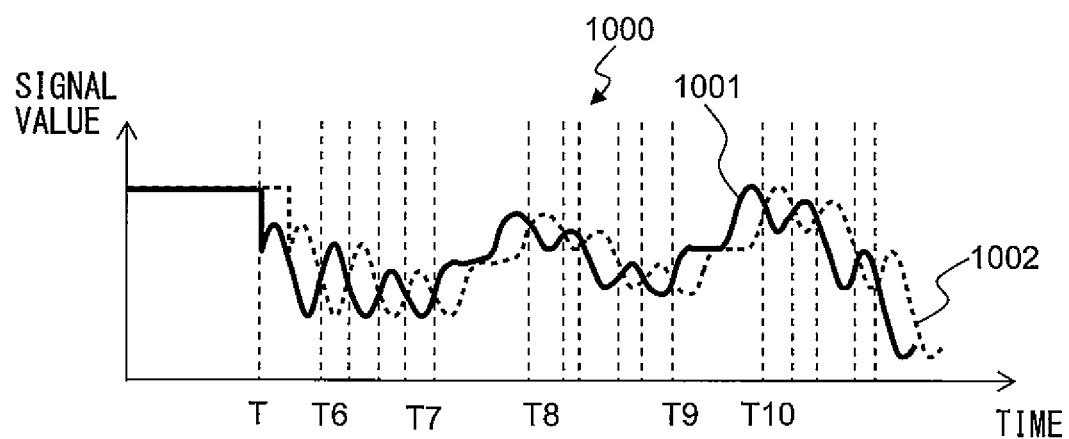
FIG. 10A is a graph for explaining a case where a noise component is not removed.
Figure 10B:
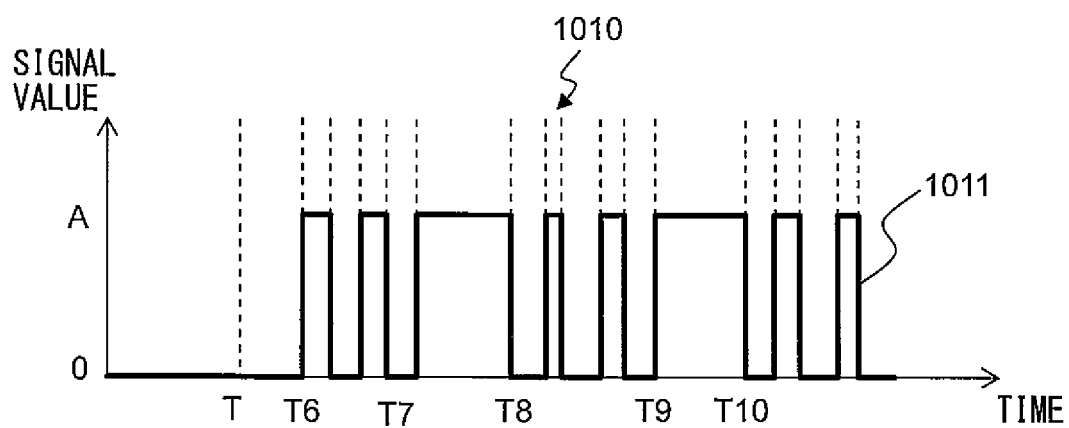
FIG. 10B is a graph for explaining a case where a noise component is not removed.

FIGS. 10A and 10B are graphs 1000, 1010 for explaining a case where a signal value of a signal obtained by delaying a conveyance signal by a predetermined period of time is used as a threshold value for comparison without removing any noise component from a conveyance signal.

The horizontal axis of the graphs 1000 and 1010 indicates a time, and the vertical axis thereof indicates a signal value. The graphs 1000 and 1010 indicate the signal values of the signals in the same time zone. The graph 1000 indicates a conveyance signal 1001 like the conveyance signal 701 and a signal 1002 obtained by delaying the conveyance signal 1001 by the predetermined period of time. The graph 1010 indicates a signal 1011 representing a comparison result of the conveyance signal 1001 and the signal 1002. When the conveyance signal 1001 is more than the signal 1002, the signal value of the signal 1011 becomes a predetermined value A, and when the conveyance signal 1001 is less than the signal 1002, the signal value of the signal 1011 becomes zero.

Like the graphs 700 to 720, in the graphs 1000 and 1010, at the time T, a document starts to be conveyed, and the disk 210 starts to rotate. However, immediately after a document starts to be conveyed, and the disk 210 starts to rotate, the signal value of the signal 1002 becomes equal to the signal value of the conveyance signal 1001 before the time T when the disk 210 was at a stop. Therefore, depending on the state of the slit 211 when the disk 210 was at a stop, at the times T to T6 immediately after the disk 210 starts to rotate, the signal value of the conveyance signal 1001 may be smaller than the signal value of the signal 1002 at all times and may be larger than the signal value of the signal 1002 at all times. In the example as shown in the graphs 1000, 1010, at the times T to T6, the signal value of the conveyance signal 1001 is smaller than the signal value of the signal 1002 at all times, and the signal value of the signal 1011 does not change. Therefore, when the signal 1011 is used, it may take time for the document conveying apparatus 100 to be able to detect that the document is conveyed.

Furthermore, due to the effect of the noise component overlaid on the conveyance signal 1001, at the times T7 to T8 and the times T9 to T10, the signal value of the conveyance signal 1001 is more than the signal value of the signal 1002 at all times, and the signal value of the signal 1011 does not change. Therefore, when the signal 1011 is used, the document conveying apparatus 100 may not be able to correctly measure the document conveying quantity, and may incorrectly determine whether a document is conveyed or not.

On the other hand, as shown in FIGS. 7A to 7C, the document conveying apparatus 100 removes the noise component according to the rotation speed of the disk 210 from the conveyance signal and then compares the conveyance signal with the threshold value, so that the document conveying apparatus 100 can correctly measure the document conveying quantity, and can accurately determine whether a document is conveyed or not.

Figure 11:
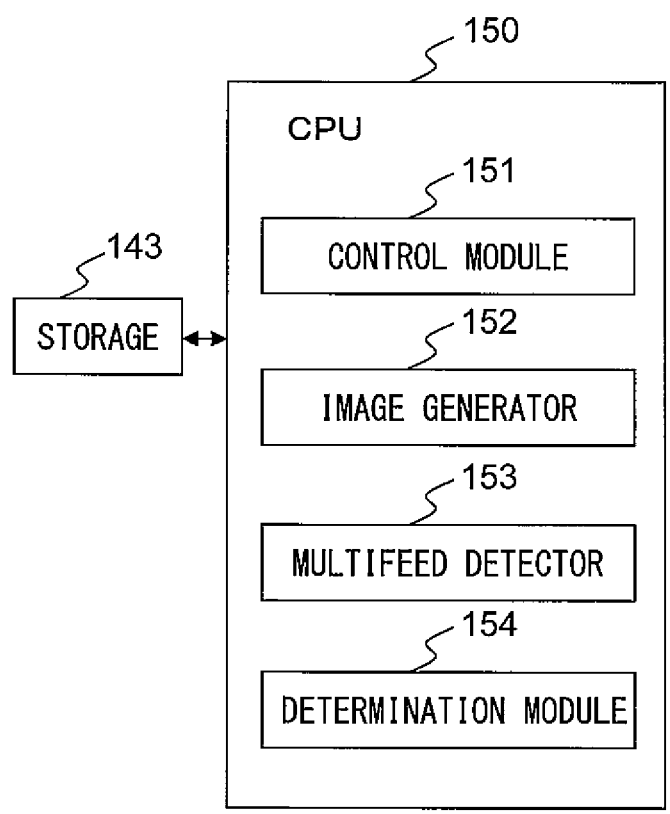
FIG. 11 is a figure illustrating a schematic configuration of a CPU 150.

FIG. 11 is a figure illustrating a schematic configuration of the CPU 150.

As depicted in FIG. 11, the CPU 150 includes a control module 151, an image generator 152, a multifeed detector 153, a determination module 154, etc. Some of these components may be functional modules implemented by software or firmware running on a processor. Note that some of these components may be formed by independent integrated circuits, microprocessors, etc.

Figure 12:
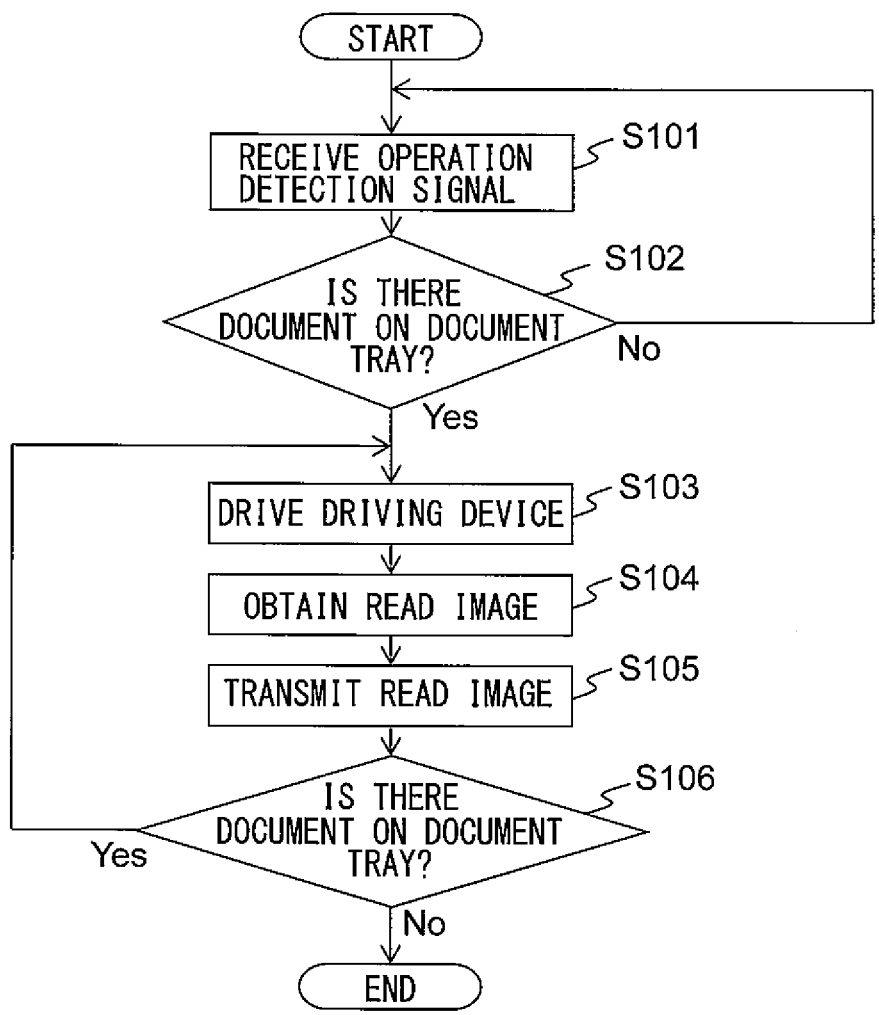
FIG. 12 is a flowchart illustrating an example of operation of the entire processing of the document conveying apparatus 100.

FIG. 12 is a flow chart illustrating an example of an operation of entire processing of the document conveying apparatus 100.

Hereinafter, an example of an operation of the entire processing of the document conveying apparatus 100 will be explained with reference to the flow chart as depicted in FIG. 12. It should be noted that the flow of the operation explained below is executed mainly by the CPU 150 in cooperation with each element of the document conveying apparatus 100 based on a program stored in the storage 143 in advance.

At first, the control module 151 waits until the control module 151 receives, from the operation button 106, an operation detection signal for commanding reading a document when a user presses down the operation button 106 for commanding reading of the document (step S101).

Subsequently, the control module 151 determines whether a document is placed on the document tray 103 or not based on a first document detection signal received from the contact sensor 111 (step S102).

When a document is not placed on the document tray 103, the control module 151 returns back to the processing in step S101, and waits until the control module 151 receives a new operation detection signal from the operation button 106.

On the other hand, when a document is placed on the document tray 103, the control module 151 drives the driving apparatus 141 to rotate a feeding and conveying roller 112, a brake roller 113, a first conveying roller 116, and a second conveying roller 121 to convey the document (step S103).

Subsequently, the image generator 152 causes an image capturing device 119 to read a conveyed document, and obtains the read image via an A/D convertor 140 (step S104).

Subsequently, the image generator 152 transmits the read image via the interface 142 to an information processing apparatus, not shown (step S105). In a case where it is not connected to the information processing apparatus, the image generator 152 stores the read image to the storage 143.

Subsequently, the control module 151 determines whether a document is remaining on the document tray 103 or not based on the first document detection signal received from the contact sensor 111 (step S106).

When a document is remaining on the document tray 103, the control module 151 returns back to the processing in step S103, and repeats the processing in steps S103 to S106. On the other hand, when a document is not remaining on the document tray 103, the control module 151 terminates the series of processing.

Figure 13:
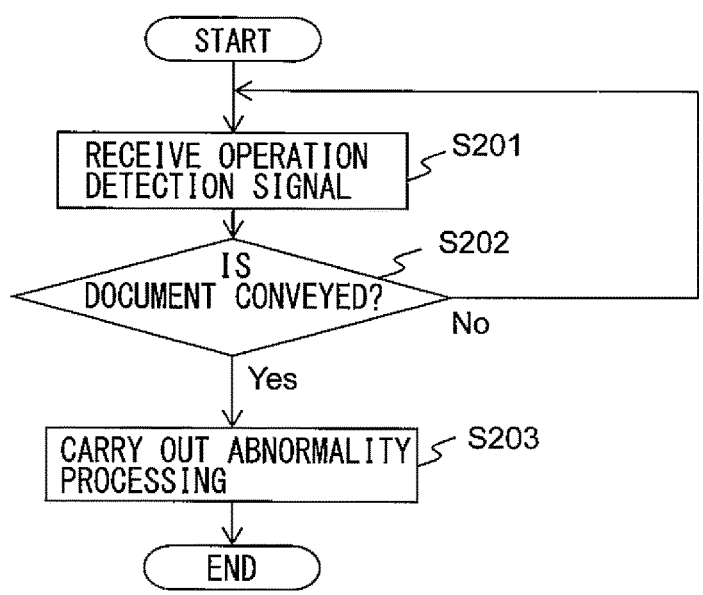
FIG. 13 is a flowchart illustrating an example of operation of jam detection processing.

FIG. 13 is a flowchart illustrating an example of operation of jam detection processing.

Hereinafter, an example of operation of jam detection processing of the document conveying apparatus 100 will be explained with reference to a flowchart shown in FIG. 13. It should be noted that the flow of the operation explained below is executed mainly by the CPU 150 by cooperating with each element of the document conveying apparatus 100 based on a program stored in the storage 143 in advance. It should be noted that the flowchart as shown in FIG. 13 is executed with a regular interval while the control module 151 drives the driving apparatus 141 and conveys documents.

First, the determination module 154 waits until the pulse signal is received from the pulse signal generation circuit 230 (step S201).

Subsequently, when the determination module 154 receives the pulse signal, the determination module 154 determines whether a document is conveyed or not based on the received pulse signal (step S202).

The determination module 154 calculates the rotation quantity of the disk 210, i.e., the document conveying quantity by counting the number of times the signal value of the pulse signal received in the predetermined period of time changes between the predetermined value A and zero, and multiplying the number of times of changes by the interval between the slits 211 of the disk 210. When the document conveying quantity in the predetermined period of time is equal to or more than the predetermined value, the determination module 154 determines that a document is conveyed, and when the document conveying quantity in the predetermined period of time is less than the predetermined value, the determination module 154 determines that a document is not conveyed.

As described above, the determination module 154 determines whether a document is conveyed or not by using the delayed signal as a predetermined threshold value and using the pulse signal representing the comparison result of the noise-removed signal and the predetermined threshold value. More specifically, the determination module 154 determines whether a document is conveyed or not by comparing the noise-removed signal with the predetermined threshold value.

When a document is determined to be conveyed, the determination module 154 returns back to the processing in step S201, and repeats the processing in steps S201 to S202.

On the other hand, when a document is determined not to be conveyed, a document is not conveyed even though the driving apparatus 141 is driven, and therefore, the determination module 154 determines that a jam occurred and carries out abnormality processing (step S203), and terminates the series of steps. As the abnormality processing, the determination module 154 stops the driving apparatus 141 to stop conveying of the document, and further, displays a message indicating that an abnormality has occurred on the display apparatus 107 to notify the user.

As described above in details, the document conveying apparatus 100 determines whether a document is conveyed or not based on the noise-removed signal obtained by removing the noise component according to the rotation speed of the disk 210 from the conveyance signal. Therefore, the document conveying apparatus 100 can determine whether a document is conveyed or not with a high degree of accuracy. Therefore, when a jam of a document occurs, the document conveying apparatus 100 can reliably stop conveying of the document and can prevent the document from being damaged. In addition, the document conveying apparatus 100 can be prevented from incorrectly determining that a jam has occurred and from stopping conveying of a document even though any jam of a document has not occurred.

Even though there is a change in the light reception level of the light reception element due to variation in the characteristics of each encoder component, the shape, or the apparatus assembly, the document conveying apparatus 100 can appropriately detect a change in the conveyance signal caused by rotation of the disk 210. Therefore, the size of the encoder component can be reduced, and the size of the entire document conveying apparatus can be reduced. Further, it is not necessary to require a high level of quality for the apparatus assembly work in order to alleviate the unevenness of the quality, and this can alleviate an increase in the number of steps related to the apparatus assembly work.

In addition, the document conveying apparatus 100 does not use a fixed threshold value as the predetermined threshold value compared with the noise-removed signal, and instead, the document conveying apparatus 100 uses the delayed signal obtained by delaying the noise-removed signal by the predetermined period of time delayed signal. Therefore, even when the bias voltage given to the noise-removed signal changes for each apparatus due to the variation of the components, etc., the document conveying apparatus 100 is able to stably detect a change in the conveyance signal.

Figure 14:
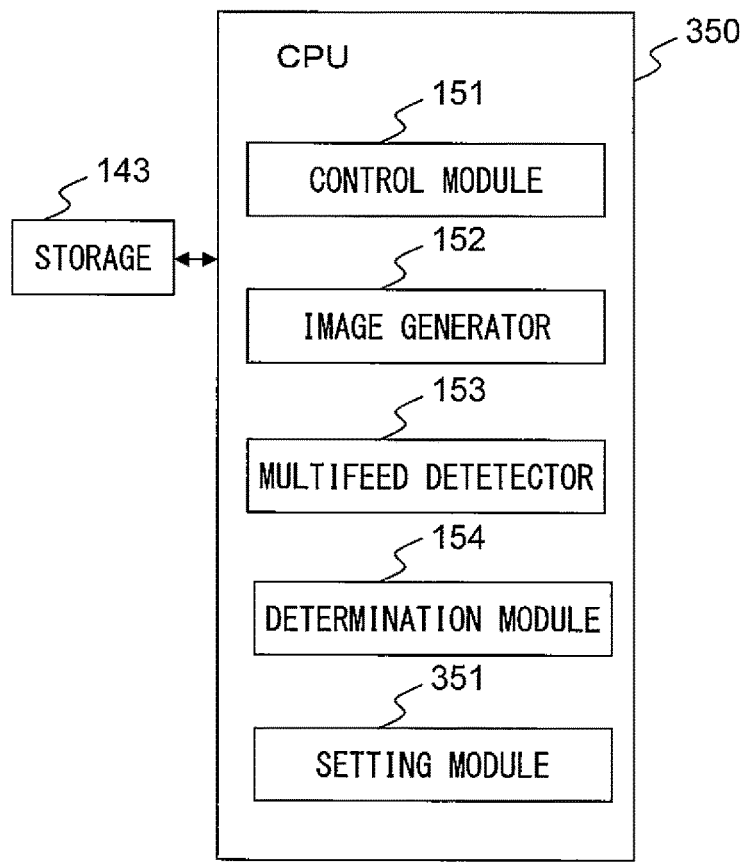
FIG. 14 is a figure illustrating a schematic configuration of a CPU 350 according to another embodiment.

FIG. 14 is a figure illustrating a schematic configuration of a CPU 350 according to another embodiment.

In this embodiment, the noise component to be removed by the low frequency component removing circuit 232 is not determined in advance, and is changed in accordance with the resolution at which a document is captured or the conveying speed of a document.

In this embodiment, variable capacitors of which capacities can be changed by the CPU 350 are used as a capacitor 236 provided in the low frequency component removing circuit 232 and a capacitor 239 provided in the delay circuit 233. Variable resistors of which resistances can be changed by the CPU 350 are used as resistors 237, 238 provided in the low frequency component removing circuit 232 and resistors 240, 241, 242 provided in the delay circuit 233.

The CPU 350 has the same hardware configuration as the CPU 150. However, the CPU 350 includes not only each unit provided by the CPU 150 but also a setting module 351, etc. The setting module 351 is a function module implemented by software operating on the processor. It should be noted that the setting module 351 may be constituted by an integrated circuit, a microprocessor, a firmware, etc., which are independent from each other.

The document conveying apparatus 100 stores, to the storage 143 in advance, resolution information which is designated by a user by using the operation button 106 or an information processing apparatus, not shown, and with which the image capturing device 119 captures an image of a document. When a document is conveyed, the setting module 351 reads resolution information from the storage 143, and in accordance with the resolution information having been read, the setting module 351 sets the rotation speed of the driving apparatus 141, and sets the conveying speed of the document. The conveying speed is configured to be faster as the resolution is smaller and configured to be slower as the resolution is larger. For example, when the resolution is 200 dpi (dots per inch), the conveying speed is configured to be 60 ppm (page per minute), and when the resolution is 600 dpi, the conveying speed is set to 15 ppm.

From the conveying speed that has been set, the setting module 351 calculates the rotation speed of the disk 210 when a document is conveyed at that conveying speed, and in accordance with the calculated rotation speed, the setting module 351 changes the capacity of the capacitor 236 and the resistance values of the resistors 237, 238. More specifically, the capacity of the capacitor 236 and the resistance values of the resistors 237, 238 are set so that, as the resolution is smaller and the conveying speed of the document and the rotation speed of the disk 210 are faster, up to higher frequency components are removed from the conveyance signal.

Instead of the resolution information, the document conveying apparatus 100 may store the conveying speed of the document to the storage 143 in advance, and may calculate the rotation speed of the disk 210 from the conveying speed stored in the storage 143.

As described above in details, the document conveying apparatus 100 changes the noise component to be removed in accordance with the resolution with which a document captured or the conveying speed of the document. Therefore, in accordance with the usage situation of the apparatus, the document conveying apparatus 100 can appropriately change the noise component to be removed, and can more accurately determine whether a document is conveyed or not.

Instead of the delayed signal, the comparison circuit 234 may use a fixed threshold value as the predetermined threshold value compared with the noise-removed signal. In this case, the determination module 154 determines whether a document is conveyed or not by comparing the noise-removed signal with the fixed threshold value. Even in this case, the document conveying apparatus 100 can detect, in a short time, a change in the conveyance signal immediately after the disk 210 stars to rotate, and can highly accurately determine whether a document is conveyed or not.

Instead of the delayed signal, the comparison circuit 234 may use an average value of the conveyance signal in a predetermined period of time in the past as the predetermined threshold value compared with the noise-removed signal. In this case, the determination module 154 determines whether a document is conveyed or not by comparing the noise-removed signal with the average value of the conveyance signal. Even in that case, the document conveying apparatus 100 can detect, in a short time, a change in the conveyance signal immediately after the disk 210 starts to rotate, and can highly accurately determine whether a document is conveyed or not. In addition, even when the bias voltage given to the noise-removed signal changes for each apparatus due to the variation of the components, etc., the document conveying apparatus 100 is able to stably detect a change in the conveyance signal and can highly accurately determine whether a document is conveyed or not.

The document conveying apparatus 100 may not use the analog circuit to generate the pulse signal from the conveyance signal, and may generate the pulse signal with digital processing performed by the CPU 150.

In this case, the pulse signal generation circuit 230 is omitted, and a conveyance signal which is output from the conveying sensor 220 is digitized by an A/D convertor, not shown, and input into the CPU 150. The CPU 150 uses Fast Fourier Transform (FFT) to generate a frequency signal obtained by performing frequency transform on the signal received from the A/D convertor. The CPU 150 uses Inverse Fast Fourier Transform to remove a low frequency component from the frequency signal and generate a noise-removed signal. Further, the CPU 150 uses the storage 143 as the buffer to generate the delayed signal from the noise-removed signal. Then, the CPU 150 compares the signal value of the noise-removed signal with the signal value of the delayed signal with a regular interval of time, and generates a pulse signal.

Even in this case, the document conveying apparatus 100 can determine whether a document is conveyed or not based on the noise-removed signal obtained by removing the noise component from the conveyance signal, and can highly accurately determine whether a document is conveyed or not.

The conveying sensor may not be the transmission light detection type, and instead, the conveying sensor may be a reflection light detection type. In this case, the light source and the light reception element are provided at the same side with respect to the disk, and instead of the slits, multiple mirrors are formed on the disk to reflect the light emitted from the light source to the light reception element. The conveying sensor may not be the rotation detection type, and instead the conveying sensor may be a straight line movement detection type. In this case, instead of the disk, the conveying sensor has a square member that moves straightly as a document is conveyed, and the square member is formed with multiple slits, which transmit light emitted from the light source, with a predetermined interval in the straight line movement direction of the square member. In these cases, the document conveying apparatus 100 can determine whether a document is conveyed or not based on the noise-removed signal obtained by removing the noise component from the conveyance signal, and can highly accurately determine whether a document is conveyed or not.

The document conveying apparatus determines as to whether a document is conveyed or not based on a signal obtained by removing the noise component according to the rotation speed of the disk, and therefore, the document conveying apparatus is capable of determining whether a document is conveyed or not with a high degree of accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A document conveying apparatus comprising:
a light source;
a first roller for conveying a conveyed document;
a second roller which contacts with the conveyed document and rotates as the document is conveyed;
a disk including a plurality of slits spaced apart with a predetermined interval in a rotation direction of the disk, the disk rotating in the rotation direction with a rotation speed, by the rotation of the second roller;
a light reception element at a position facing the light source with the disk interposed therebetween;
a first signal generator for generating a first signal in accordance with light received by the light reception element;
a second signal generator for generating a second signal obtained by removing, from the first signal, a noise component of the light according to the rotation speed of the disk; and
a controller for determining whether the document is conveyed by comparing the second signal with a signal value of a delayed signal obtained by delaying the second signal by a predetermined period of time, wherein the predetermined period of time is greater than zero.

2. The document conveying apparatus according to claim 1, wherein the noise component is determined to be a component of a frequency which is equal to or more than a number of rotations of the disk per second and equal to or less than four times the number of rotations of the disk per second.

3. The document conveying apparatus according to claim 1 further comprising an image capturing module for capturing an image of a conveyed document, wherein the noise component is changed in accordance with a resolution with which the image of the conveyed document is captured.

4. A determination method for a document conveying apparatus including a light source, a first roller for conveying a conveyed document, a second roller which contacts with the conveyed document and rotates as the document is conveyed, a disk rotating with a rotation speed by the rotation of the second roller, and a light reception element at a position facing the light source with the disk interposed therebetween, the determination method comprising:
generating a first signal in accordance with a light received by the light reception element;
generating a second signal obtained by removing, from the first signal, a noise component according to a rotation speed of the disk; and
determining whether the document is conveyed in the document conveying apparatus, by comparing the second signal with a signal value of a delayed signal obtained by delaying the second signal by a predetermined period of time, wherein the predetermined period of time is greater than zero.

5. A computer-readable, non-transitory medium storing a computer program, wherein the computer program causes a document conveying apparatus which comprises a light source, a first roller for conveying a conveyed document, a second roller which contacts with the conveyed document and rotates as the document is conveyed, a disk rotating with a rotation speed by the rotation of the second roller, and a light reception element at a position facing the light source with the disk interposed therebetween, to execute a process, the process comprising:
generating a first signal in accordance with a light received by the light reception element;
generating a second signal obtained by removing, from the first signal, a noise component according to a rotation speed of the disk; and
determining whether the document is conveyed in the document conveying apparatus, by comparing the second signal with a signal value of a delayed signal obtained by delaying the second signal by a predetermined period of time, wherein the predetermined period of time is greater than zero.

* * * * *